United States Patent
Litovsky et al.

(10) Patent No.: US 9,985,596 B1
(45) Date of Patent: May 29, 2018

(54) ACOUSTIC DEVICE

(71) Applicant: Bose Corporation, Framingham, MA (US)

(72) Inventors: Roman N. Litovsky, Newton, MA (US); Michael Tiene, Franklin, MA (US); Cory Roberts, Mendon, MA (US)

(73) Assignee: Bose Corporation, Framingham, MA (US)

( * ) Notice: Subject to any disclaimer, the term of this patent is extended or adjusted under 35 U.S.C. 154(b) by 0 days. days.

(21) Appl. No.: 15/594,923

(22) Filed: May 15, 2017

(51) Int. Cl.
| | |
|---|---|
| H04R 1/02 | (2006.01) |
| H03G 5/16 | (2006.01) |
| H04R 3/04 | (2006.01) |
| H04R 3/12 | (2006.01) |
| G06F 3/16 | (2006.01) |

(52) U.S. Cl.
CPC ............ *H03G 5/165* (2013.01); *G06F 3/165* (2013.01); *H04R 1/025* (2013.01); *H04R 3/04* (2013.01); *H04R 3/12* (2013.01)

(58) Field of Classification Search
CPC ........................................................ H04R 1/02
See application file for complete search history.

(56) References Cited

U.S. PATENT DOCUMENTS

| | | | | |
|---|---|---|---|---|
| 8,761,431 B1 * | 6/2014 | Jackson | ............... | H04R 5/0335 381/367 |
| 9,319,770 B2 * | 4/2016 | Oishi | ..................... | H04R 1/105 |
| 9,571,917 B2 | 2/2017 | Litovsky et al. | | |
| 9,654,867 B2 | 5/2017 | Litovsky et al. | | |
| 9,736,574 B2 | 8/2017 | Litovsky et al. | | |
| 2007/0258614 A1 * | 11/2007 | Langberg | ............. | H04R 1/1041 381/379 |
| 2008/0166002 A1 * | 7/2008 | Amsel | ................... | H04R 1/025 381/370 |
| 2009/0262967 A1 * | 10/2009 | Bryan | ...................... | H04R 5/02 381/333 |
| 2012/0275615 A1 * | 11/2012 | Kelly | ....................... | H04R 5/04 381/74 |
| 2014/0126760 A1 * | 5/2014 | Tse | ........................... | H04R 5/02 381/334 |
| 2014/0334661 A1 * | 11/2014 | Besgen, Sr. | .......... | H04R 1/1066 381/388 |
| 2016/0073200 A1 * | 3/2016 | Yoo | ...................... | H04R 5/0335 381/311 |
| 2016/0337747 A1 | 11/2016 | Litovsky et al. | | |
| 2017/0026751 A1 * | 1/2017 | Suzuki | ................ | H04R 25/606 |
| 2017/0111733 A1 | 4/2017 | Litovsky et al. | | |
| 2017/0272852 A1 * | 9/2017 | Kamada | ............... | H04R 1/1075 |

* cited by examiner

*Primary Examiner* — Olisa Anwah
(74) *Attorney, Agent, or Firm* — Brian M. Dingman; Dingman IP Law, PC

(57) ABSTRACT

An acoustic device with a housing with a central portion and first and second leg portions that depend from the central portion, a first acoustic driver carried by the first leg portion, a second acoustic driver carried by the second leg portion, and an audio signal control system that directs audio signals to each of the first and second drivers, where the drivers transduce the audio signals to output sounds. The audio signal control system is arranged to apply first and second equalization modes to the audio signals in a first and second listening mode, respectively. The second equalization de-emphasizes frequencies below a first threshold frequency and boosts frequencies above the first threshold frequency.

27 Claims, 9 Drawing Sheets

ACOUSTIC DEVICE

BACKGROUND

This disclosure relates to an acoustic device.

Acoustic devices that are designed to be worn draped over the shoulders generally do not produce sound at a sufficient amplitude when they are used as portable speakers, placed on a surface such as a desk or table. If the volume is turned up, battery life is adversely affected.

SUMMARY

All examples and features mentioned below can be combined in any technically possible way.

In one aspect, an acoustic device includes a housing with a central portion and first and second leg portions that depend from the central portion, a first acoustic driver carried by the first leg portion, a second acoustic driver carried by the second leg portion, and an audio signal control system that directs audio signals to each of the first and second drivers, where the drivers transduce the audio signals to output sounds. The audio signal control system is arranged to apply first and second equalization modes to the audio signals in a first and second listening mode, respectively. The second equalization de-emphasizes frequencies below a first threshold frequency and boosts frequencies above the first threshold frequency.

Embodiments may include one of the following features, or any combination thereof. The first threshold frequency may comprise a frequency in a range of about 100-200 Hz. The first equalization mode may de-emphasize frequencies below a second threshold frequency, where the second threshold frequency is below the first threshold frequency. The de-emphasis by the first equalization mode of frequencies below the second threshold frequency may be accomplished acoustically. The first listening mode may comprise a personal listening mode, wherein the acoustic device is operated while worn on a user's body. The second listening mode may comprise an out-loud listening mode, wherein the acoustic device is operated while placed somewhere other than on a user's body. Applying the second equalization mode in the out-loud listening mode may result in greater sound pressure level at frequencies above about 100-200 Hz than if the first equalization mode were applied in the out-loud listening mode. Applying the second equalization mode in the out-loud listening mode may result in sound pressure level that is at least 7 dB greater at frequencies above about 100-200 Hz than if the first equalization mode were applied in the out-loud listening mode.

Embodiments may include one of the following features, or any combination thereof. The housing may comprise a first acoustic waveguide with a first fundamental frequency and that is acoustically coupled to the first acoustic driver, and a second acoustic waveguide with a second fundamental frequency and that is acoustically coupled to the second acoustic driver. The second equalization mode may result in effectively no sound pressure level at frequencies below the first and second fundamental frequencies. The housing may comprise a loop that is constructed and arranged to be worn draped over the shoulders of a user. The first equalization mode may be designed for use in a first listening mode where the loop is draped over the shoulders of the user. The second equalization mode may be designed for use in a second listening mode where the loop is off the shoulders of the user. The second equalization mode may be designed for use while the loop is resting on a surface.

Embodiments may include one of the following features, or any combination thereof. The acoustic device may further comprise a switching device that switches between the first and second equalization modes. The switching may occur automatically or manually. The switching device may comprise at least one of a body sensor and a motion sensor. The switching device may be responsive to a signal received from an electronic device with an equalization mode switching application. The switching device may comprise a user-operable switch carried by the housing.

Embodiments may include one of the following features, or any combination thereof. The acoustic device may further comprise a dock that is constructed and arranged to cradle the housing. The dock may comprise a third acoustic driver, and when the housing is cradled in the dock the third acoustic driver may be operably connected to the audio signal control system, which directs audio signals comprising low frequency content to the third acoustic driver. The third acoustic driver may be arranged to transduce the low frequency content to output low frequency sounds. The audio signal control system may be further arranged to apply a third equalization mode to the audio signals in a third listening mode, wherein the third listening mode occurs when the housing is cradled in the dock. The audio signal control system may comprise circuitry for reducing low frequency content in the output sounds while allowing a boost in mid and high frequency content in the output sounds. The second equalization mode may accomplish de-emphasis of frequencies below the first threshold frequency through a compressor configured to substantially eliminate sound pressure level at frequencies below the first threshold frequency. The compressor may be configured to be triggered at a higher threshold in the second listening mode than in the first listening mode.

In another aspect, an acoustic device includes a housing with a central portion and first and second leg portions that depend from the central portion, a first acoustic driver carried by the first leg portion, a second acoustic driver carried by the second leg portion, a first acoustic waveguide with a first fundamental frequency, the first acoustic waveguide being acoustically coupled to the first acoustic driver, and a second acoustic waveguide with a second fundamental frequency, the second acoustic waveguide being acoustically coupled to the second acoustic driver. An audio signal control system directs audio signals to each of the first and second drivers, where the drivers transduce the audio signals to output sounds. The audio signal control system is arranged to apply first and second equalization modes to the audio signals in a first and second listening mode, respectively, where the second equalization mode results in effectively no sound pressure level at frequencies below the first and second fundamental frequencies. The second equalization mode may boost frequencies above about 100-200 Hz.

In another aspect, an acoustic device includes a housing comprising a loop that is constructed and arranged to be worn draped over the shoulders of a user, with a central portion and first and second leg portions that depend from the central portion, a first acoustic driver carried by the first leg portion, and a second acoustic driver carried by the second leg portion. An audio signal control system directs audio signals to each of the first and second drivers, where the drivers transduce the audio signals to output sounds. The audio signal control system is arranged to apply first and second equalization modes to the audio signals in a first and second listening mode, respectively, where the second equalization mode de-emphasizes frequencies below a first threshold frequency and boosts frequencies above the first threshold frequency. There is a dock that is constructed and arranged to cradle the housing, wherein the dock comprises a third acoustic driver. When the housing is cradled in the dock the third acoustic driver is operably connected to the audio signal control system, which directs audio signals comprising low frequency content to the third acoustic driver. The third acoustic driver is arranged to transduce the low frequency content to output low frequency sounds. The first equalization mode may be designed for use in a first listening mode where the loop is draped over the shoulders of the user, and the second equalization mode may be designed for use in a second listening mode where the loop is off the shoulders of the user.

DETAILED DESCRIPTION

The present acoustic device may be of a type that is designed to be worn draped over the shoulders, with loudspeakers located on each side of the device, below the ears. Such devices are designed to produce sound at a relatively low amplitude and may be configured and/or equalized to reduce spillage that may be bothersome to other people located nearby the device wearer. The device can also be taken off the body and used as a portable speaker. In order for the device to produce sound at a sufficient amplitude when used as a portable speaker this way, the device control system implements two equalizations, one designed for the personal use mode and the other designed for the out-loud mode. In the out-loud mode the low-frequency content is de-emphasized and additional gain is applied to the mid and high-frequency content. The result is that the loudspeakers play up to 10 dB louder, but the device uses only about twice the power of the personal use mode. The acoustic device can thus be used satisfactorily as both a personal device and an out-loud device.

Figure 1:
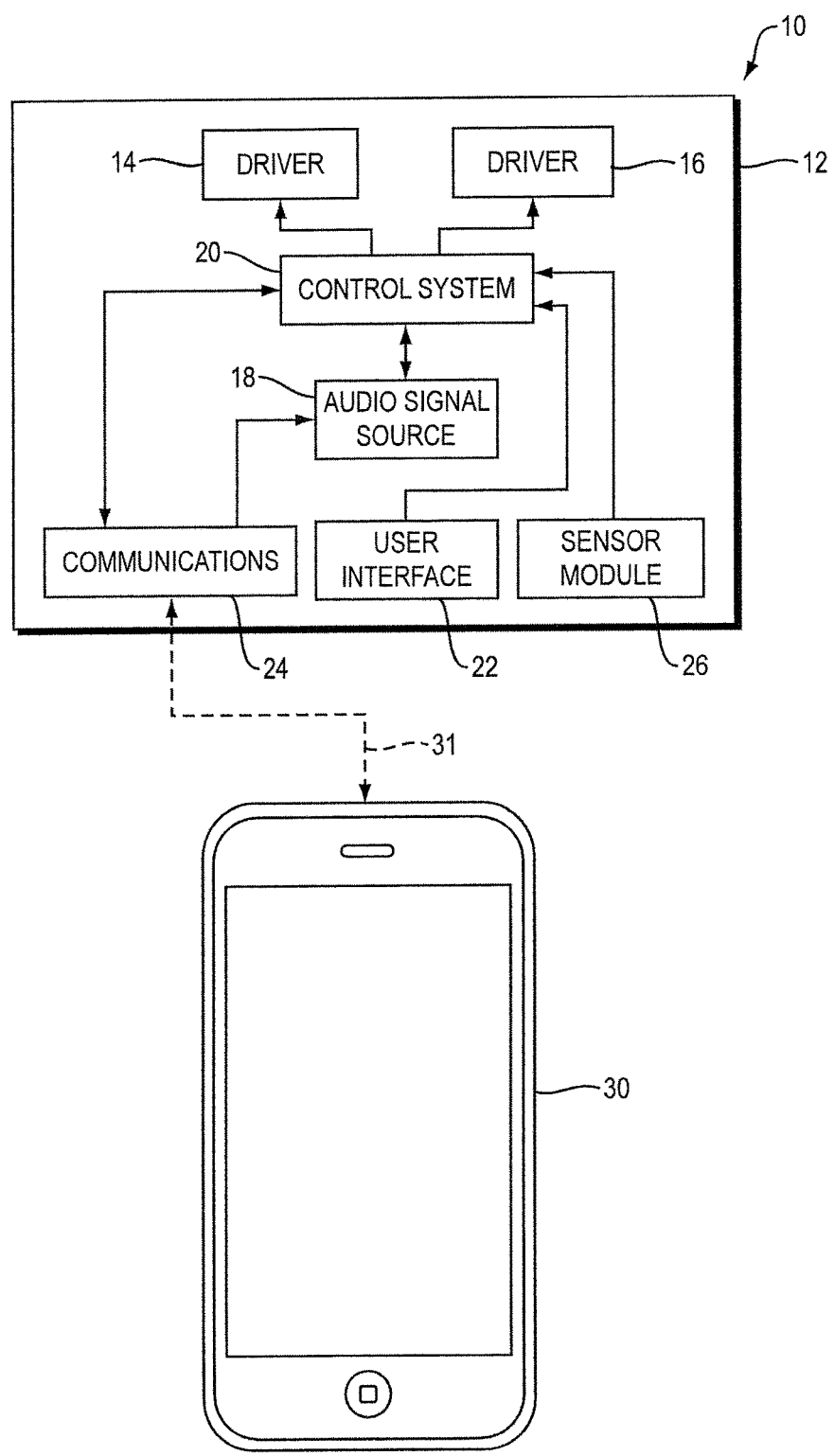
FIG. 1 is functional block diagram of an acoustic device.
Figure 2:
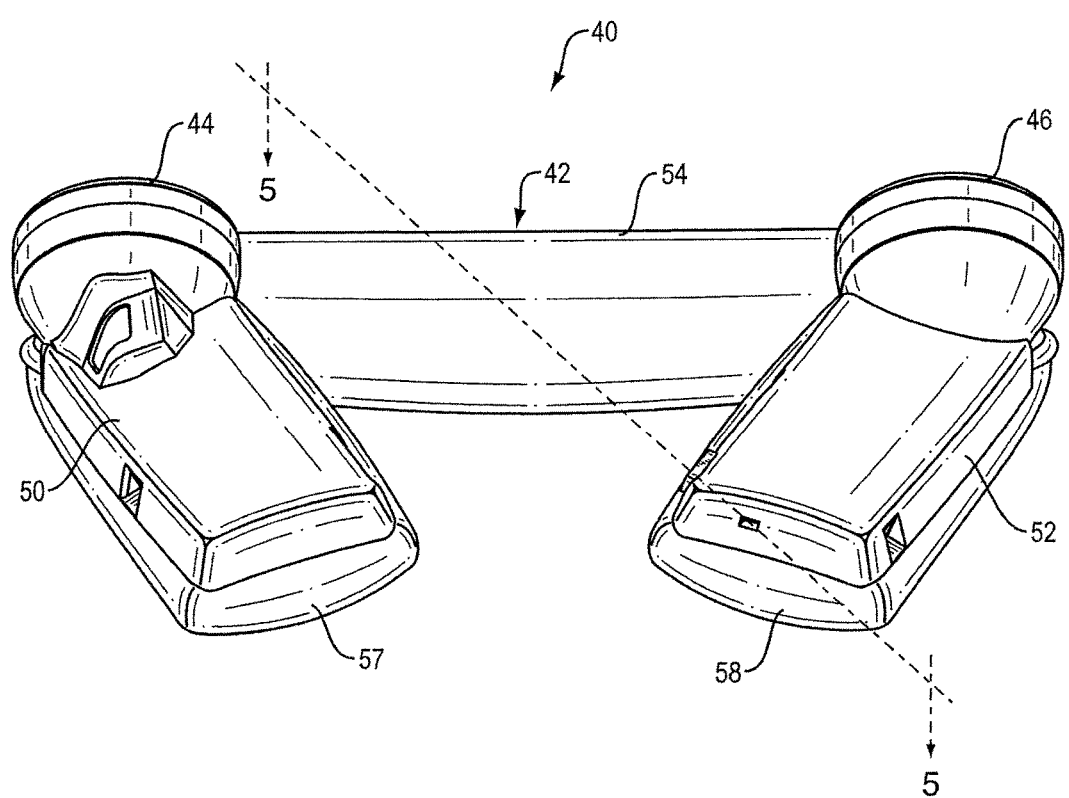
FIG. 2 is a front view of an acoustic device.
Figure 3:
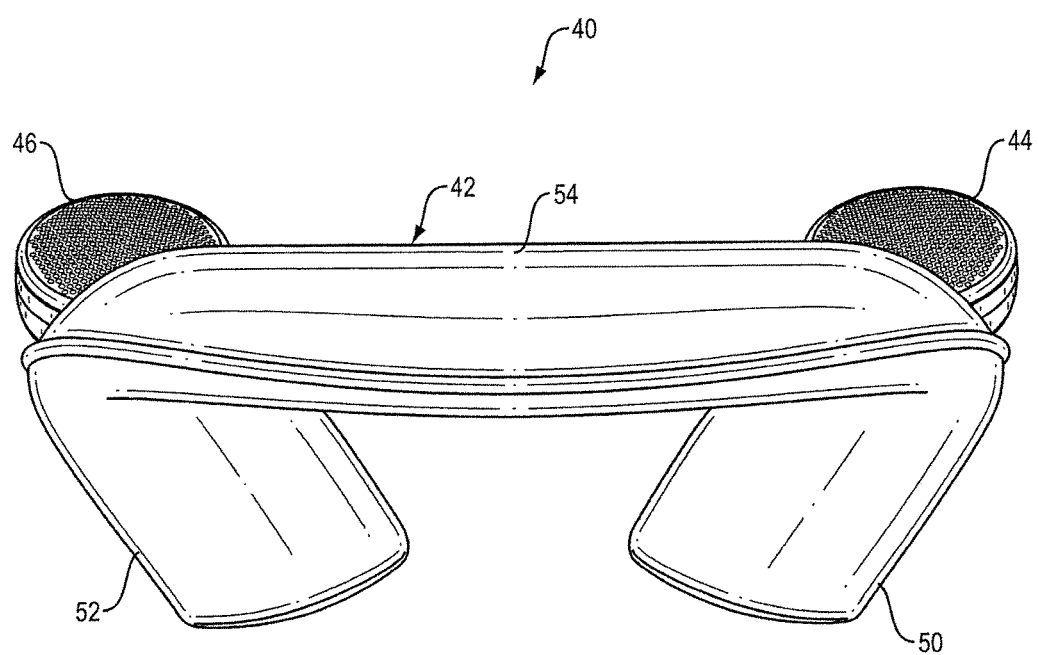
FIG. 3 is a rear view of the acoustic device of FIG. 2.
Figure 9:
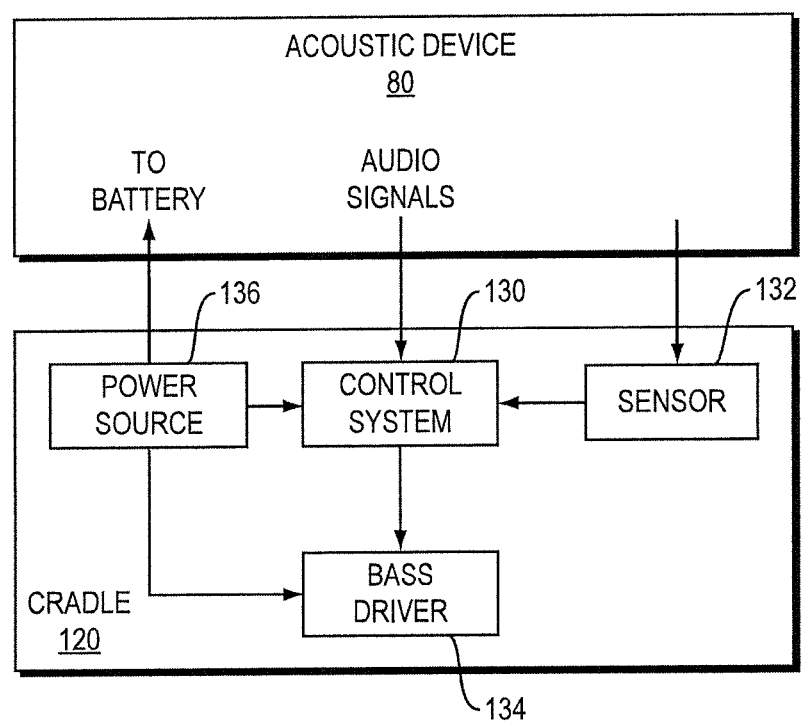
FIG. 9 is a functional block diagram of the cradle of FIGS. 8A and 8B.

Elements of FIGS. 1 and 9 are shown and described as discrete elements in a block diagram. These may be implemented as one or more of analog circuitry or digital circuitry. Alternatively, or additionally, they may be implemented with one or more microprocessors executing software instructions. The software instructions can include digital signal processing instructions. Operations may be performed by analog circuitry or by a microprocessor executing software that performs the equivalent of the analog operation. Signal lines may be implemented as discrete analog or digital signal lines, as a discrete digital signal line with appropriate signal processing that is able to process separate signals, and/or as elements of a wireless communication system.

When processes are represented or implied in the block diagram, the steps may be performed by one element or a plurality of elements. The steps may be performed together or at different times. The elements that perform the activities may be physically the same or proximate one another, or may be physically separate. One element may perform the actions of more than one block. Audio signals may be encoded or not, and may be transmitted in either digital or analog form. Conventional audio signal processing equipment and operations are in some cases omitted from the drawing.

FIG. 1 is a schematic functional diagram of acoustic device 10. Acoustic device 10 includes a housing 12. Housing 12 carries at least two acoustic drivers (transducers), 14 and 16. In the examples depicted in FIGS. 2-6 device 10 is a shoulder-wearable audio device that is adapted to convey audio to the wearer's ears while minimizing audio spilled to others nearby the user. However, this disclosure is not limited to a shoulder-wearable audio device and includes other audio devices such as on-ear, in-ear, and off-ear headphones and other portable devices with at least two drivers. All of the electrical and electronic components of device 10 could be powered by a rechargeable battery, not shown.

Audio signal source 18 provides audio signals that are transduced by drivers 14 and 16. The audio signals can be present in memory (not shown) in device 10, and/or can be provided to device 10 by one or more separate audio source devices, as is known in the field. One example of a separate audio source is portable device 30 (e.g., a smartphone or a tablet), which is adapted to communicate with device 10 as indicated by connection 31 between portable device 30 and communications module 24 of device 10. Such communication can be wired, or wireless, as is known in the field.

If acoustic device 10 is designed to be worn draped over the shoulders, with loudspeakers located on each side of the device, below or proximate the ears, audio signal control system 20 may be adapted to process audio signals so as to produce sound at a relatively low amplitude and equalized to reduce spillage. Device 10 can, of course, be taken off the body and used as a portable out-loud speaker. In order for device 10 to produce sound at a sufficient amplitude when used as a portable speaker this way, control system 20 implements two equalizations, a first equalization designed for the personal use mode (where the device is worn on the shoulders), and a second equalization designed for the out-loud listening mode. In the out-loud mode, control system 20 can apply an equalization that de-emphasizes low-frequency content as compared to the personal use mode. In the out-loud mode, control system 20 may also apply an equalization that provides additional gain to the mid and high-frequency content so that the acoustic device has sufficient volume to be heard out-loud. In one non-limiting example, the out-loud equalization accomplishes both reduced low-frequency energy and increased energy at mid and high frequencies, as is further detailed below.

One of many possible results of the out-loud equalization mode is that in the out-loud mode the acoustic device plays louder than it otherwise does in the personal use mode. In one non-limiting example, the acoustic device plays up to about 10 dB louder in the out-loud mode than in the personal use mode. However, because low-frequency sounds require more power to play at a particular volume as compared to mid and high-frequency sounds, de-emphasizing (or eliminating) low frequencies saves substantial power. In one non-limiting example of the out-loud equalization mode, frequencies below a threshold frequency that is preferably but not necessarily in the range of about 100-200 Hz are greatly reduced or essentially eliminated, and additional gain of about 10 dB is applied at frequencies above about this threshold. A result is that audio is played about 10 dB higher (which normally would increase power use by about ten times), but power use is only increased by about two times because all the energy that would have been used to play the low frequency sounds has been saved. Battery life is thus reduced by only about half, as opposed to being reduced by about ten times (or more) if the low frequencies were played as in the personal use mode. Accordingly, control system 20 can be enabled to accomplish an out-loud equalization that causes device 10 to use only slightly more power than the personal use mode. Acoustic device 10 can thus be used satisfactorily as both a personal audio device and an out-loud audio device.

In one example of the acoustic device, the two drivers are driven out of phase, at least at low frequencies. The out of phase operation results in far-field sound cancellation and thus less spillage at low frequencies. When an acoustic device with drivers driven out of phase is used for out-loud listening, since the low frequencies are cancelled in the far field the user is not obtaining the benefit of the low frequency sound. Thus, the acoustic device can save power in the out-loud mode by not playing (or, greatly de-emphasizing) low frequencies.

In order to satisfactorily provide for the two equalization modes, acoustic device 10 should have a mechanism that either automatically or manually switches between the two modes. Manual switching can be accommodated via user interface 22 (e.g., with a physical switch), or via a user-operable equalization switching control on an application ("app") on remote device 30 that communicates with control system 20 through communications module 24. Other means of accomplishing manual switching are contemplated. Automatic switching can be accommodated using sensor module 26 that communicates with control system 20. Sensor module 26 could be a switch that is engaged when device 10 is placed on a hard surface (e.g., a contact switch), or it could be a body sensor (e.g., a temperature sensor, an IR sensor, or a capacitive sensor) that senses when the device is being worn on the human body, or not. Another alternative would be an inertial sensor (e.g., a MEMS accelerometer/gyroscope device) or another sensor that detects motion, since small or large motions (e.g., from breathing, moving the torso, or walking) would be likely to occur when the device is worn over the shoulders.

Switching between equalization modes may in some non-limiting examples accommodate some form of time constant or delay, to ease the transition between modes. For example, if the device is switched from out-loud mode to personal mode, the volume should be reduced immediately because the drivers will be within inches of the ear and the high sound pressure level (SPL) of the out-loud mode could be uncomfortable. In contrast, at least for the expected few seconds after the device is taken off the shoulders and is placed on a table or another surface for out-loud listening, the SPL should either not increase or perhaps should increase gradually, to avoid a high SPL at the ears. Any time delay, from zero on up, is contemplated. Time delays and gradual volume changes/equalization changes, can be accomplished using control system 20.

Figure 4:
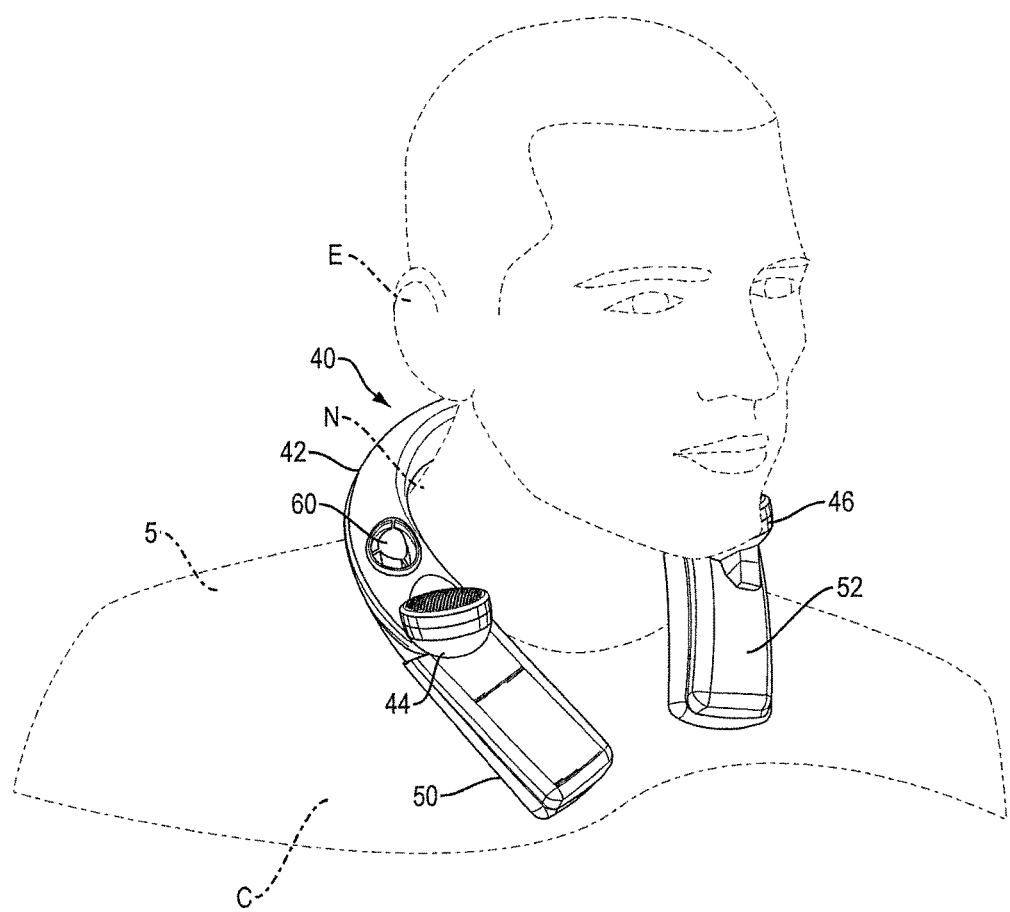
FIG. 4 shows the acoustic device of FIGS. 2 and 3 worn by a user.
Figure 5:
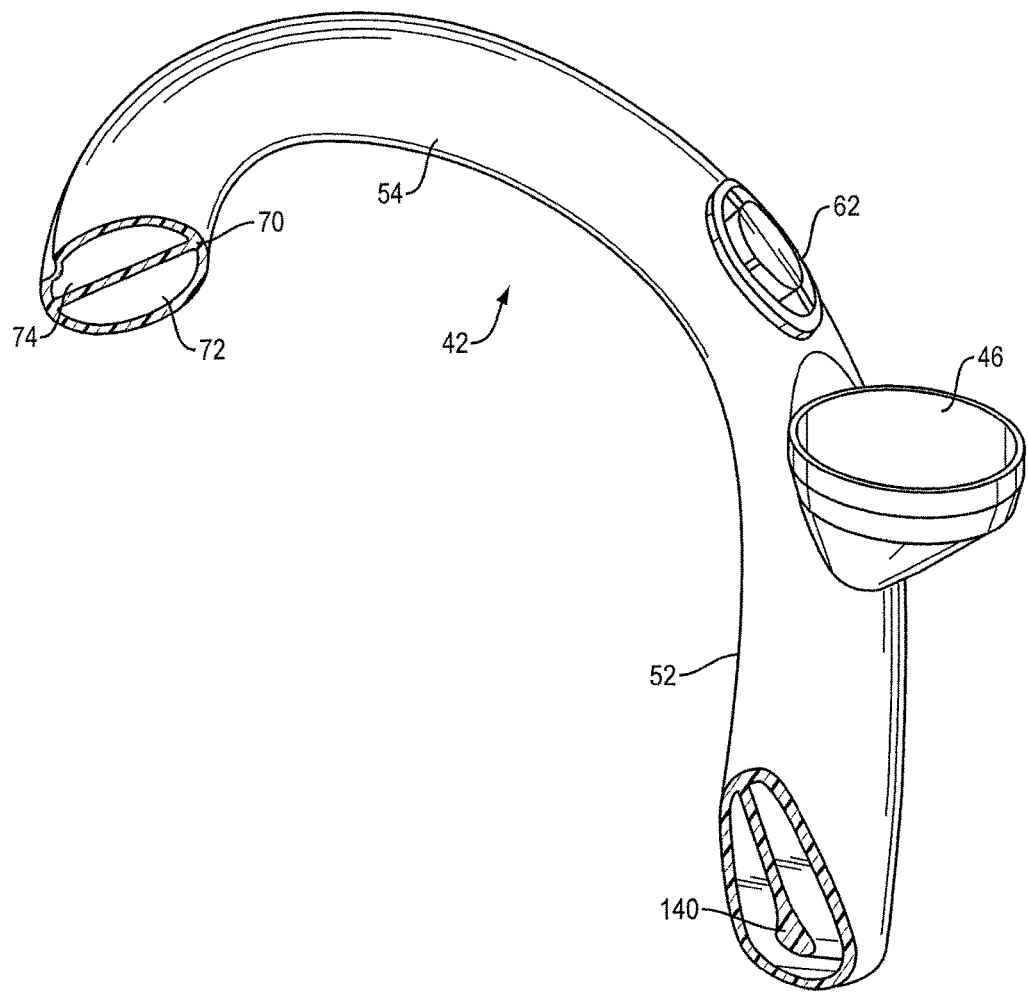
FIG. 5 is a cross-section taken along line 5-5, FIG. 2.

Two of many possible physical configurations of the acoustic device are shown FIGS. 2-6. Acoustic device 40, FIGS. 2-5, includes an elongated, generally "U"-shaped loop housing 42, with central portion 54, and right and left depending leg portions 50 and 52 (with distal ends 57 and 58, respectively). Driver 44 is carried in or on the top of leg 50, and driver 46 is carried in or on the top of leg 52. Each driver may be pointed generally at the expected location of an ear "E" as shown in FIG. 4. In other examples, each driver may be substantially flush with the top of housing 42. Device 40 sits on the shoulders "S" and upper chest "C," and extends behind neck "N." Also, in one example, the rear of each driver radiates into an acoustic waveguide, with the outlets of the waveguides in the leg that is opposite the leg that carries the driver. So, driver 44 is carried by right leg 50 and its waveguide outlet 62 is in left leg 52, generally proximate the left-side driver 46 and below the expected location of the left ear. Left-side driver 46 is carried by left leg 52 and its waveguide outlet 60 is in right leg 50, generally proximate right side driver 44 and below right ear E. Each ear thus receives SPL both directly from the front of one transducer, and, via a waveguide, from the back of the other transducer. FIG. 5 is a cross-section taken along line 5-5, FIG. 2, and illustrates example waveguides 72 and 74 that lie within wall 70 of housing 42.

Figure 6A:
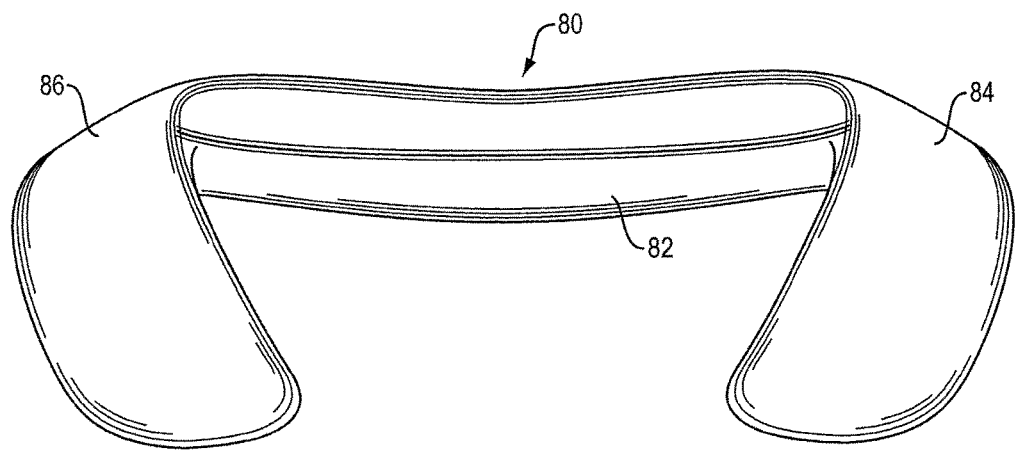
FIGS. 6A and 6B are views similar to those of FIGS. 2 and 3, respectively, illustrating an alternative acoustic device.
Figure 6B:
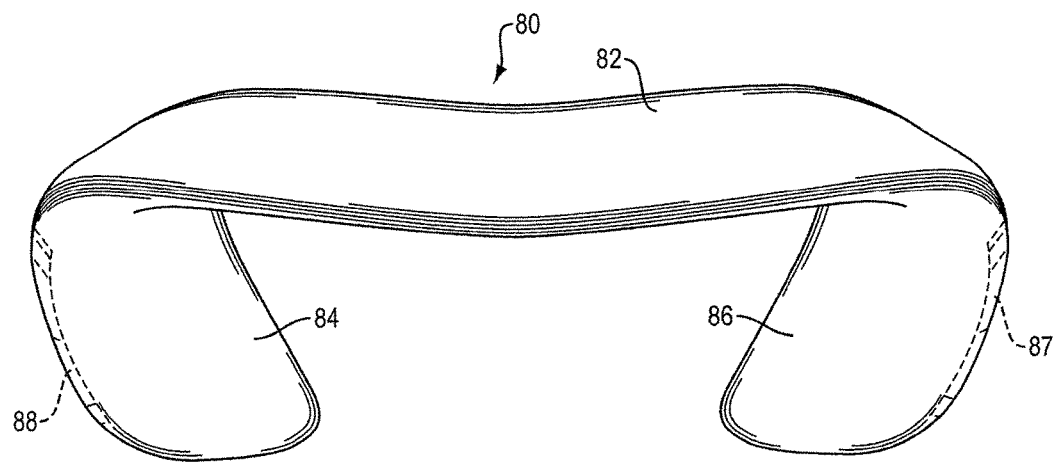

FIGS. 6A and 6B show another acoustic device 80, where a fabric cover may be used to create a more aesthetically-pleasing product. Device 80 maintains the generally "U"-shaped appearance, with central portion 82, and left and right depending leg portions 84 and 86. Areas 87 and 88 can house all of the electronics, sensors, and the user interface. In this example, the drivers (not shown) are housed within the acoustic device 80. As in the examples of FIGS. 2-5, there may be a first driver on the left depending leg portion 84 and a second driver on the right depending leg portion 86. The back of the first driver may be connected to a corresponding waveguide, with its outlet on the opposite leg, i.e., the right depending leg portion 86. The back of the second driver may be connected to a corresponding waveguide, with its outlet on the opposite leg, i.e., the left depending leg portion 84.

Shoulder-worn acoustic devices of the type shown and described herein are further described in U.S. Pat. No. 9,571,917, and US Patent Application Publications 2017/0111733, 2016/0337747, 2016/0255431, and 2016/0021446. The disclosures of each of these patents and publications are incorporated by reference herein in their entireties.

Figure 7:
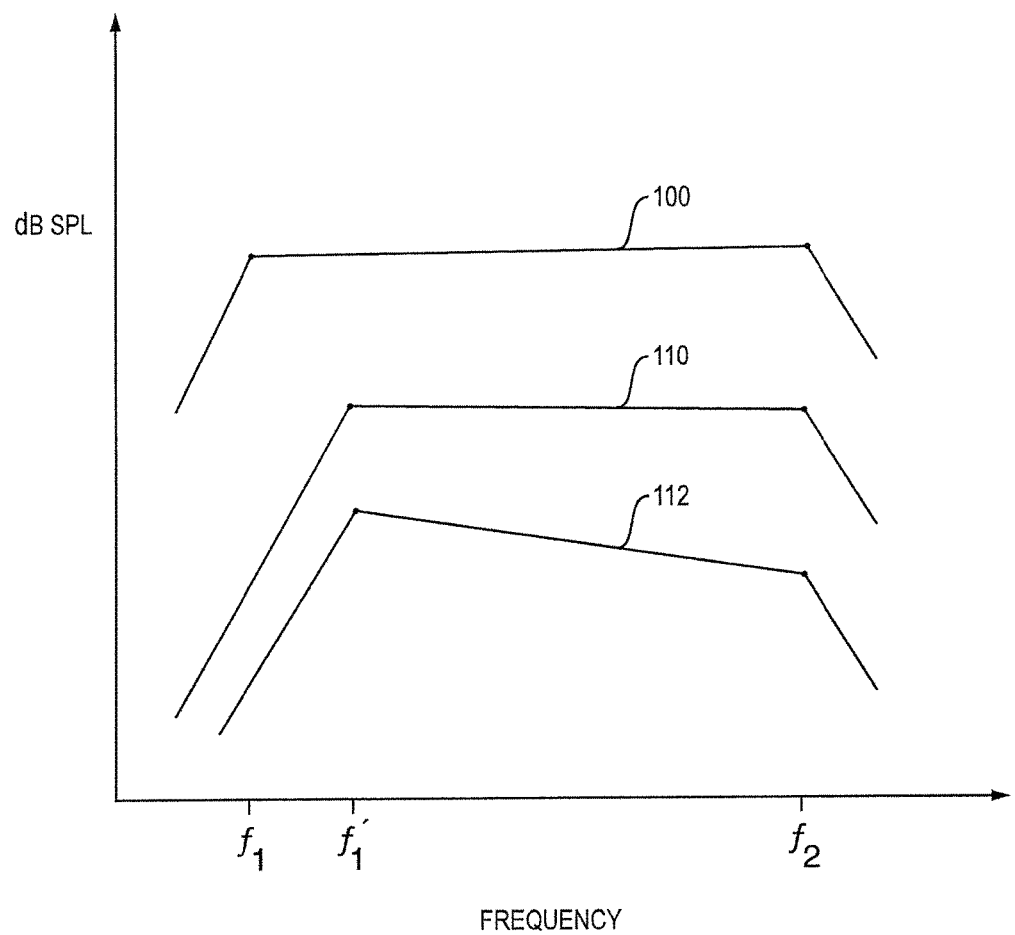
FIG. 7 is a plot of sound pressure level (SPL) vs. frequency for different equalization modes of operation of the acoustic device, with the device in separate use positions.

An example of results of an acoustic device employing two different equalization modes are illustrated in FIG. 7, which plots perceived SPL at the ears as a function of frequency. Both the personal use mode and the out-loud mode are illustrated; these equalization modes are as described above, with a personal use equalization designed for when the device is worn over the shoulders, and an out-loud equalization designed for when the device is taken off the body and placed on a surface such as a table or desk. In the shoulder listening position and with the acoustic device in the personal use equalization mode (curve 100), frequencies from f1 to f2 are played at a relatively high SPL. Frequencies below f1 are acoustically de-emphasized, due to the out-of-phase operation of the acoustic drivers and the fundamental frequency of the waveguides. In one non-limiting example, f1 can be in the range of about 100-200 Hz, preferably about 150 Hz. However, f1 can be selected at other desired frequencies or frequency ranges, for example by different waveguide configurations and/or appropriate equalization. Curve 112 illustrates the SPL for the device in this same personal use equalization mode, but with the device sitting on a table in an out-loud listening position. As can be seen, bass frequencies (from f1 to f1') are reduced due to cancellation because the drivers are driven out of phase, while SPL at mid and high frequencies (from f1 to f2) is low and the frequency response is not flat. Curve 110 illustrates the SPL for the device in the same table location, but with the out-loud equalization instead of the personal use equalization mode. Bass frequencies below threshold f1' are reduced (because they are electrically removed or de-emphasized in this mode by the equalization that is applied), but the SPL is much higher at mid and high frequencies (from f1' to f2) than when the device is in the personal use mode due to the intentional boost in mid and high frequencies by the equalization that is applied. Further, the frequency response is generally flat. As described above, the higher SPL is achieved with only a modest increase in power use (and thus a modest decrease in battery life).

In the table listening position, in order for sound to be perceived at a reasonable level the SPL needs to be increased over what is accomplished with the personal use or shoulder equalization. The out-loud or table equalization preferably but not necessarily produces about 7 dB (or more) greater output above about 100-200 Hz. Both equalization modes preferably accomplish sharp drop off in SPL below about 100-200 Hz. In the personal use equalization, the acoustic configuration of the device (e.g., the drivers being operated out-of-phase at low frequencies and the waveguide configuration and geometry) preferably accomplish a sharp drop off in SPL below the fundamental frequency of the waveguides (which, in some examples, can be about 100-200 Hz). In the out-loud equalization, the control system may be enabled to effectively eliminate mid-bass and lower frequency output, i.e., below about 150 dB, or, more generally, below about 100-200 Hz. This may be accomplished with limiters or compressors, as is known in the art. It has been found that eliminating output below about 100-200 Hz, and increasing SPL above about 100-200 Hz generally by about 7 or more dB, increases system efficiency by up to about five times. Thus, a 7-10 dB SPL increase can be accomplished, while reducing battery life by only about 50%. Also, for acoustic devices with waveguides that carry sound the waveguides will have a fundamental frequency, which is the frequency with a quarter wavelength equal to about the effective length of the waveguide. Eliminating or reducing frequencies below the waveguide(s) fundamental frequencies will save substantial amounts of power.

For acoustic devices that use compressors as described above, compressors are typically triggered by high energy low frequency events. In cases where low frequency content is eliminated, such low-frequency events will not occur, and so the compressor is not active as frequently as it would be if the low frequencies were still present. This allows the threshold on the compressor(s) to be increased, which will help to maintain or have less impact on the mid and high frequency output. This enables further increased output in the mid and high frequencies. Accordingly, the out-loud equalization could be applied in addition to an increased threshold on the compressors to boost mid and high frequency output.

For the out-loud equalization, low frequency content is effectively de-emphasized electronically, so those frequencies are never reproduced by the drivers. For the personal use equalization, an equalization is applied to control the low frequency content, but the acoustic configuration of the waveguides operating below their resonant frequency effectively provides for cancellation of these frequencies in the far field. However, the drivers are still reproducing these frequencies so the user can hear them when the drivers are close to the ears. But if the user is in the far field (i.e., with the acoustic device off the shoulders) the low frequency content will cancel, so the user is not getting any benefit of hearing them. This would lead to higher power consumption without substantial benefit if the personal use equalization was used when the device was off the shoulders. Also, the two described equalizations can be effective for shoulder listening vs. table listening for different types of portable acoustic devices, including but not limited to the configurations shown in FIGS. 2-6.

Figure 8A:
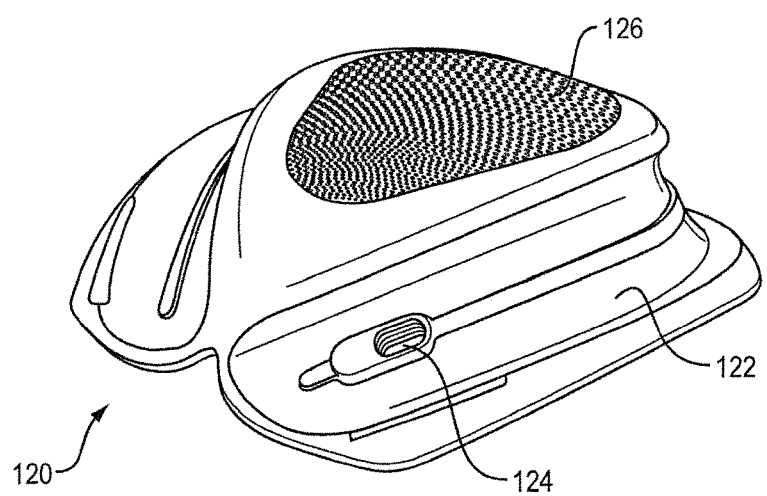
FIG. 8A is a perspective view of a cradle for an acoustic device.
Figure 8B:
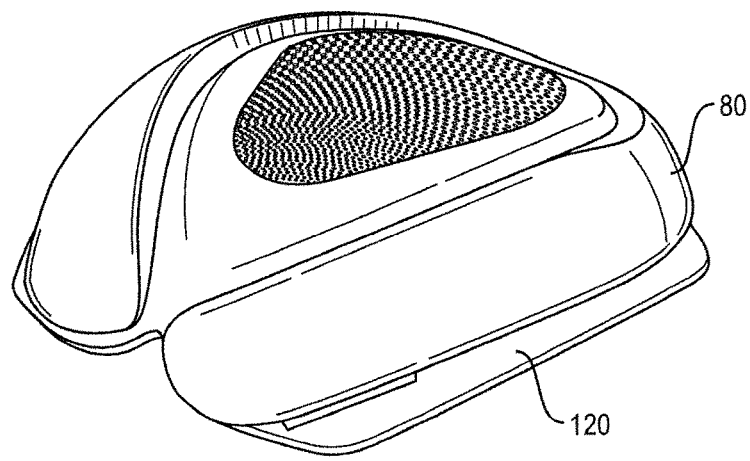
FIG. 8B shows an acoustic device coupled to the cradle.

FIG. 8A illustrates a cradle 120 that can be used as one or both of a charging station and an out-loud listening device for an acoustic system of the type described herein. In this non-limiting example, cradle 120 comprises receiving slot 122 that is sized and shaped to allow acoustic device 80, FIG. 6, to be held in and on cradle 120, as shown in FIG. 8B. Cradle 120 can include functional access port 124 that can allow for the transfer of battery charging power from cradle 120 into acoustic device 80 and/or can allow acoustic signals to be transferred from device 80 into cradle 120. Cradle 120 can include one or more acoustic drivers behind grille 126. Such driver(s) can be used to augment the sound from acoustic device 80. Since in one example in the out-loud equalization mode device 80 does not play low frequencies, cradle 120 can be (but need not be) enabled to play low frequencies via its on-board driver(s).

FIG. 9 is a functional block diagram of acoustic device 80 docked in cradle 120. It should be understood that the functionality of cradle 120 depicted in FIG. 9 is exemplary, not limiting. Sensor 120 can sense when device 80 is docked, for example using a contact switch. Audio signals can be passed from acoustic device 80 to control system 130 of cradle 120, and power to recharge the audio device battery can be supplied via cradle power source 136. When sensor 120 senses that an acoustic device has been docked, it sends a signal to control system 130, which then enables audio signals from acoustic device 80 to be played on bass driver 134. Control system 130, and/or the audio device control system (e.g., control system 20, FIG. 1) is preferably but not necessarily arranged to apply a third equalization mode to the acoustic signals in a third listening mode, wherein the third listening mode occurs when the acoustic device is cradled in the dock. This third equalization mode may boost the low frequencies relative to the first and/or second equalization modes. Since in one example the out-loud equalization mode effectively eliminates lower frequencies, the third equalization mode could restore the eliminated low frequency content. As a result of driver 134 and/or the third equalization mode, when device 80 is docked the sound that device 80 plays is augmented, particularly in the bass frequencies that are largely missing from the device 80 output in the out-loud equalization mode, by sound played via driver 134. Cradle 120 thus helps to both recharge device 80 and increase the low-frequency content of audio played by device 80.

Embodiments of the systems and methods described above comprise computer components and computer-implemented steps that will be apparent to those skilled in the art. For example, it should be understood by one of skill in the art that the computer-implemented steps may be stored as computer-executable instructions on a computer-readable medium such as, for example, floppy disks, hard disks, optical disks, Flash ROMS, nonvolatile ROM, and RAM. Furthermore, it should be understood by one of skill in the art that the computer-executable instructions may be executed on a variety of processors such as, for example, microprocessors, digital signal processors, gate arrays, etc. For ease of exposition, not every step or element of the systems and methods described above is described herein as part of a computer system, but those skilled in the art will recognize that each step or element may have a corresponding computer system or software component. Such computer system and/or software components are therefore enabled by describing their corresponding steps or elements (that is, their functionality), and are within the scope of the disclosure.

A number of implementations have been described. Nevertheless, it will be understood that additional modifications may be made without departing from the scope of the inventive concepts described herein, and, accordingly, other embodiments are within the scope of the following claims.

What is claimed is:

1. An acoustic device, comprising:
   a housing with a central portion and first and second leg portions that depend from the central portion, wherein the housing comprises a loop that is constructed and arranged to be worn draped over the shoulders of a user;
   a first acoustic driver carried by the first leg portion;
   a second acoustic driver carried by the second leg portion; and
   an audio signal control system that directs audio signals to each of the first and second drivers, where the drivers transduce the audio signals to output sounds;
   wherein the audio signal control system is arranged to apply first and second equalization modes to the audio signals in a first and second listening mode, respectively, wherein the first equalization mode is designed for use in the first listening mode where the loop is draped over the shoulders of the user, and the second equalization mode is designed for use in the second listening mode where the loop is off the shoulders of the user, and where the second equalization mode de-emphasizes frequencies below a first threshold frequency and boosts frequencies above the first threshold frequency.

2. The acoustic device of claim 1, wherein the first threshold frequency comprises a frequency in a range of about 100-200 Hz.

3. The acoustic device of claim 1, wherein the first equalization mode de-emphasizes frequencies below a second threshold frequency, where the second threshold frequency is below the first threshold frequency.

4. The acoustic device of claim 3, wherein the de-emphasis by the first equalization mode of frequencies below the second threshold frequency is accomplished acoustically.

5. The acoustic device of claim 1, wherein the first listening mode comprises a personal listening mode.

6. The acoustic device of claim 1, wherein the second listening mode comprises an out-loud listening mode, wherein the acoustic device is operated while placed somewhere other than on a user's body.

7. The acoustic device of claim 6, wherein applying the second equalization mode in the out-loud listening mode results in greater sound pressure level at frequencies above about 100-200 Hz than if the first equalization mode were applied in the out-loud listening mode.

8. The acoustic device of claim 6, wherein applying the second equalization mode in the out-loud listening mode results in sound pressure level that is at least 7 dB greater at frequencies above about 100-200 Hz than if the first equalization mode were applied in the out-loud listening mode.

9. The acoustic device of claim 1, wherein the housing comprises a first acoustic waveguide with a first fundamental frequency and that is acoustically coupled to the first acoustic driver, and a second acoustic waveguide with a second fundamental frequency and that is acoustically coupled to the second acoustic driver, and wherein the second equalization mode results in effectively no sound pressure level at frequencies below the first and second fundamental frequencies.

10. The acoustic device of claim 1, wherein the second equalization mode is designed for use while the loop is resting on a surface.

11. The acoustic device of claim 1, further comprising a switching device that switches between the first and second equalization modes.

12. The acoustic device of claim 11, wherein the switching occurs automatically.

13. The acoustic device of claim 12, wherein the switching device comprises at least one of a body sensor and a motion sensor.

14. The acoustic device of claim 11, wherein the switching occurs manually.

15. The acoustic device of claim 14, wherein the switching device is responsive to a signal received from an electronic device with an equalization mode switching application.

16. The acoustic device of claim 14, wherein the switching device comprises a user-operable switch carried by the housing.

17. The acoustic device of claim 1, further comprising a dock that is constructed and arranged to cradle the housing.

18. The acoustic device of claim 17, wherein the dock comprises a third acoustic driver, and when the housing is cradled in the dock, the third acoustic driver is operably connected to the audio signal control system, which directs audio signals comprising low frequency content to the third acoustic driver, and the third acoustic driver is arranged to transduce the low frequency content to output low frequency sounds.

19. The acoustic device of claim 18, wherein the audio signal control system is further arranged to apply a third equalization mode to the audio signals in a third listening mode, wherein the third listening mode occurs when the housing is cradled in the dock.

20. The acoustic device of claim 1, wherein the audio signal control system comprises circuitry for reducing low frequency content in the output sounds while allowing a boost in mid and high frequency content in the output sounds.

21. The acoustic device of claim 1, wherein the second equalization mode accomplishes de-emphasis of frequencies below the first threshold frequency through a compressor configured to substantially eliminate sound pressure level at frequencies below the first threshold frequency.

22. The acoustic device of claim 21, wherein the compressor is configured to be triggered at a higher threshold in the second listening mode than in the first listening mode.

23. An acoustic device, comprising:
   a housing with a central portion and first and second leg portions that depend from the central portion;
   a first acoustic driver carried by the first leg portion;
   a second acoustic driver carried by the second leg portion;
   a first acoustic waveguide with a first fundamental frequency, the first acoustic waveguide being acoustically coupled to the first acoustic driver;

a second acoustic waveguide with a second fundamental frequency, the second acoustic waveguide being acoustically coupled to the second acoustic driver; and an audio signal control system that directs audio signals to each of the first and second drivers, where the drivers transduce the audio signals to output sounds;

wherein the audio signal control system is arranged to apply first and second equalization modes to the audio signals in a first and second listening mode, respectively, where the second equalization mode results in effectively no sound pressure level at frequencies below the first and second fundamental frequencies.

24. The acoustic device of claim 23, wherein the second equalization mode boosts frequencies above about 100-200 Hz.

25. An acoustic device, comprising:

a housing comprising a loop that is constructed and arranged to be worn draped over the shoulders of a user, with a central portion and first and second leg portions that depend from the central portion;

a first acoustic driver carried by the first leg portion;

a second acoustic driver carried by the second leg portion;

an audio signal control system that directs audio signals to each of the first and second drivers, where the drivers transduce the audio signals to output sounds;

wherein the audio signal control system is arranged to apply first and second equalization modes to the audio signals in a first and second listening mode, respectively, where the second equalization mode de-emphasizes frequencies below a first threshold frequency and boosts frequencies above the first threshold frequency; and a dock that is constructed and arranged to cradle the housing, wherein the dock comprises a third acoustic driver;

wherein when the housing is cradled in the dock the third acoustic driver is operably connected to the audio signal control system, which directs audio signals comprising low frequency content to the third acoustic driver, and wherein the third acoustic driver is arranged to transduce the low frequency content to output low frequency sounds.

26. The acoustic device of claim 25, wherein the first equalization mode is designed for use in a first listening mode where the loop is draped over the shoulders of the user, and the second equalization mode is designed for use in a second listening mode where the loop is off the shoulders of the user.

27. An acoustic device, comprising:

a housing with a central portion and first and second leg portions that depend from the central portion;

a first acoustic driver carried by the first leg portion;

a second acoustic driver carried by the second leg portion;

an audio signal control system that directs audio signals to each of the first and second drivers, where the drivers transduce the audio signals to output sounds;

wherein the audio signal control system is arranged to apply first and second equalization modes to the audio signals in a first and second listening mode, respectively, where the second equalization mode de-emphasizes frequencies below a first threshold frequency and boosts frequencies above the first threshold frequency; and a dock that is constructed and arranged to cradle the housing, wherein the dock comprises a third acoustic driver, and when the housing is cradled in the dock the third acoustic driver is operably connected to the audio signal control system, which directs audio signals comprising low frequency content to the third acoustic driver, and the third acoustic driver is arranged to transduce the low frequency content to output low frequency sounds.

\* \* \* \* \*